United States Patent [19]
Lescourret

[11] Patent Number: 4,866,260
[45] Date of Patent: Sep. 12, 1989

[54] METHOD AND MEANS FOR MEASURING THE FREQUENCY OF A PERIODIC SIGNAL

[75] Inventor: Jean-Louis Lescourret, Bourg les Valence, France

[73] Assignee: Crouzet (Société Anonyme Francaise), Montrouge, France

[21] Appl. No.: 246,852

[22] Filed: Sep. 20, 1988

[30] Foreign Application Priority Data

Sep. 21, 1987 [FR] France .................... 87 13023

[51] Int. Cl.⁴ ............................................. G01R 23/02
[52] U.S. Cl. ................................. 324/78 R; 324/78 F
[58] Field of Search ............... 324/78 R, 78 D, 78 F, 324/78 J, 77 R, 77 B, 77 C, 77 CS, 77 D, 77 E, 77 F, 79 R, 79 D; 364/485; 307/261, 521; 328/141; 455/158

[56] References Cited
U.S. PATENT DOCUMENTS 3,978,416 8/1976 Sutphin, Jr. ................... 324/78 F
3,986,112 10/1976 Hamilton ........................ 324/78 R
4,057,756 11/1977 Ley et al. ........................ 324/78 D Primary Examiner—Michael J. Tokar
Attorney, Agent, or Firm—Lowe, Price, LeBlanc, Becker & Shur

[57] ABSTRACT

Frequency measurement involves anti-foldover filtering (1) of an analog signal whose frequency i.e. to be measured, followed by sampling of the filtered analog signal and analog-digital conversion of the samples, then digital band-pass filtering (3) on a slaved basis. Associated calculation (4–7) utilizes a linear regression having a single coefficient a for the linear relation between successive digitized samples (2) and to estimate the coefficient a for approximation of the frequency to be measured. The invention is particularly applicable to signals from a probe having nuclear magnetic resonance used in measuring intensity of the terrestrial magnetic field disturbed by metallic masses.

16 Claims, 3 Drawing Sheets

METHOD AND MEANS FOR MEASURING THE FREQUENCY OF A PERIODIC SIGNAL

The present invention relates to a method and means for measuring frequency of a periodic signal, in particular of sinusoidal or quasi-sinusoidal form and having a power maximum or power maxima in very narrow frequency bands.

Applications include signals from a nuclear magnetic resonance probe, usually of very great sensitivity, and intended for measuring intensity of terrestrial magnetic field disturbed by metallic masses.

A typical such probe is an oscillator supplying a signal $S(t)$ of the form $$S(t) = A \sin 2\pi F_x t + B(t)$$

where the frequency $F_x$ is proportional to the intensity of the terrestrial magnetic field and $B(t)$ represents noise.

In frequency measuring means of conventional pulse counting type, the signal $S(t)$ is shaped to obtain rectangular pulses of width $T=1/F_x$, passed through a divider (by D), and transformed to a series of rectangular pulses of width DT, for counting the number n of clock pulses of width $T_H$ during each pulse of width NT, to obtain $F_x$ by the relation $$F_x = D/nT_H$$

Such frequency measuring means are usually sensitive to ambient climatic conditions, including temperature, humidity etc.

In the intended field of application, it is desirable for precision of frequency measurements to reach $10^{-8}$ in the frequency range from 1000 to 3000 Hz. If use of a pass band of about 1 Hz is not to be impaired, and where a signal to noise ratio, in power for the detecting probe signals can be considerably lower than 1, such precision cannot be achieved by conventional frequency measurement techniques.

Also, in the presence of noise, foldover distortion effects on the frequencies, or fluttering thereof, adversely affects sensitivity of conventional frequency measurement.

An object of the present invention is to mitigate the drawbacks of such conventional frequency measurement.

According to one aspect of the present invention a method of measuring the frequency $F_x$ of a periodic signal $S(t)$ comprises the steps of:

(i) filtering the signal $S(t)$ to limit foldover distortion;

(ii) sampling the filtered signal $S(t)$ at a rate $Fe=1/Te$, and digitising the samples;

(iii) filtering the digitised samples to increase the signal-to-noise ratio;

(iv) using linear regression based on a single coefficient a for a linear relation between successive digitised samples and calculating at a repetition rate Fe/N estimation of the coefficient a, thence to arrive at the desired measurement of frequency $F_x$.

In one preferred implementation of the method of the invention, the linear regression employs the method of least squares, and filtering of the digitised samples is relative to a narrow band-pass centered at a central frequency tied to estimated frequency of the sampled and digitised signal.

A linear relation to which said linear regression is applied is advantageously $$s_{n+2} + s_n = a \cdot s_{n+1}$$

where $a = 2 \cos 2\pi F_x Te$.

When sampling is at a rate Fe lower than the frequency $F_x$ to be measured, the signal $S(t)$ is preferably filtered prior to sampling on a band-pass basis centered at a frequency tied to the frequency to be measured.

When sampling is at a rate Fe greater than the frequency $F_x$ to be measured, the signal $S(t)$ is preferably filtered prior to sampling on a low-pass basis.

Advantageously, the sampling rate Fe is determined from the measured frequency $F_x$.

Preferably, said linear regression starts from mean values of variables estimated for a suitable time horizon NTe.

A suitable band-pass filter for said samples is represented by the function $$s_{n+2} = (\lambda \hat{a}^*) s_{n+1} - \lambda^2 s_n + \gamma S_{n+2}$$

where $\alpha$ is a constant representing damping and width of of the filter at $-3$ dB, $\hat{a}^*$ is an estimation of a filtered by a low-pass filter to give a value of a parameter determining the center of the pass-band, $\gamma$ is a framing/centering constant fixing static gain of the band-pass filter, $S_n$ is a filtered sample at instant nTe, $S_{n+2}$ is an unfiltered sample at instant (n+2)Te.

Further preferably, sub-sampling is done and the required frequency $F_x$ is determined at a rate L times lower than the rate for the coefficient a.

To determine the value of the coefficient a, at a rate that is fixed and independent of Fe, predetermined frequency desynchronisation is done using an interpolator or extrapolator filter.

Using a sampling frequency Fe that is lower than the frequency $F_x$ to be measured, the latter is determined by adding to the calculated frequency Fa the product of the sampling rate Fe and a whole number K.

For initialisation purposes, estimations of a and of $F_x$ over several seconds are calculated and the mean value of the estimation of $F_x$ is adopted as an initial value.

Another aspect of this invention concerns frequency measuring means (frequency meter) comprising series connection of anti-foldover analog filter means, means for sampling and analog-digital conversion of the samples, regulated digital band-pass filter means, and calculating means operative according to a linear regression based on a single coefficient a for linear relation between successive digitised samples, and to calculate estimation of the coefficient a from which the frequency to be measured is derived.

Advantageously, the anti-foldover analog filter comprises at least one switched-capacitance band-pass filter receiving a switching signal from a first programmable divider receiving a reference clock signal and controlled by the calculation means.

Preferably, the anti-foldover analog filter comprises at least one low-pass smoothing filter.

Preferably, the sampling and digitising means receives a sampling signal from a second programmable divider receiving a reference clock signal and controlled by the calculating means.

The calculating means controls the programmable dividers by way of means for calculating the switching and sampling rates and means for monitoring these rates.

Initialisation means can be connected to the input of the means for calculating the switching and sampling rates.

The digital filter is preferably controlled by the calculating means by way of a digital low-pass filter.

Implementation of the invention will be better understood from the following description of a frequency meter embodying the invention, and of its operation, made with reference to the accompanying drawings, in which.

The frequency measuring means (frequency meter) now to be described aims to determine the frequency $F_x$ of a periodic analog signal $S(t)$.

Figure 1:
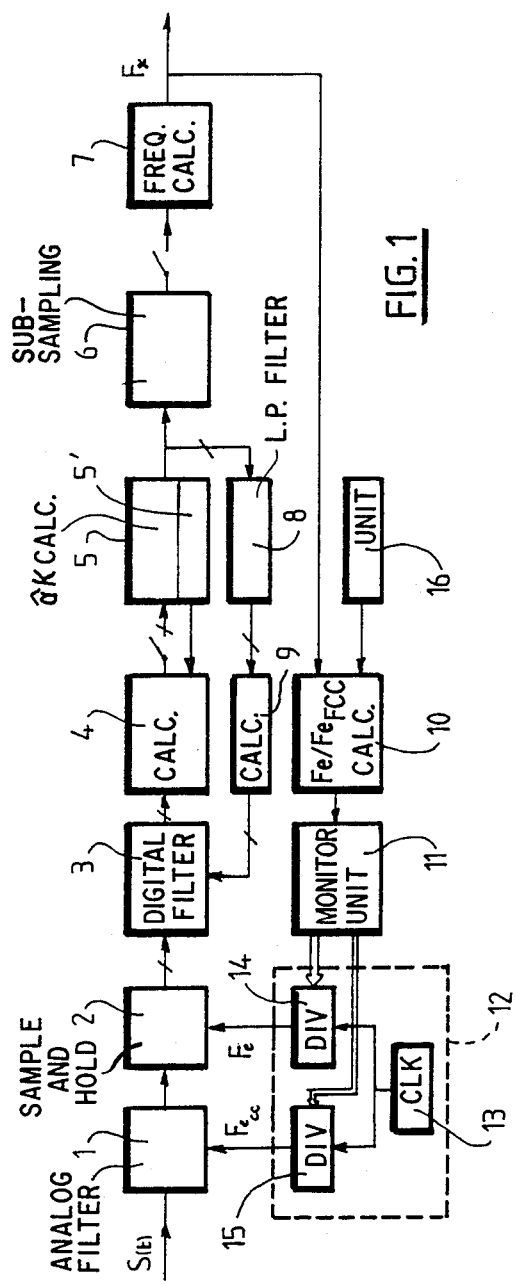
FIG. 1 is a block diagram representative of frequency measuring by an embodiment of the invention.

The block diagram of FIG. 1 shows, connected in series, an anti-folding analog filter 1, which receives on is input the analog signal $S(t)$, a device 2 for sampling-holding and for analog-digital conversion, a slaved digital band-pass filter 3 having a very narrow band, a calculating unit 4, a unit 5 for calculating $â_K$ (defined hereinunder), a filtering and sub-sampling unit 6, and a frequency calculating unit 7. The unit 5 is looped back to the band-pass digital filter 3 by a smoothing low-pass digital filter 8 and a calculating unit 9. The output of the calculating unit 7 is connected to the input of a unit 10 for calculating Fe and $Fe_{Fcc}$ which controls a unit 11 for monitoring these frequencies, which, in turn, controls a unit 12 having a reference clock 13 for two programmable dividers 14 and 15 to supply Fe and $Fe_{Fcc}$, respectively, from the unit 12. An initialisation unit 16 is connected to the input of the calculating unit 10.

Figure 2:
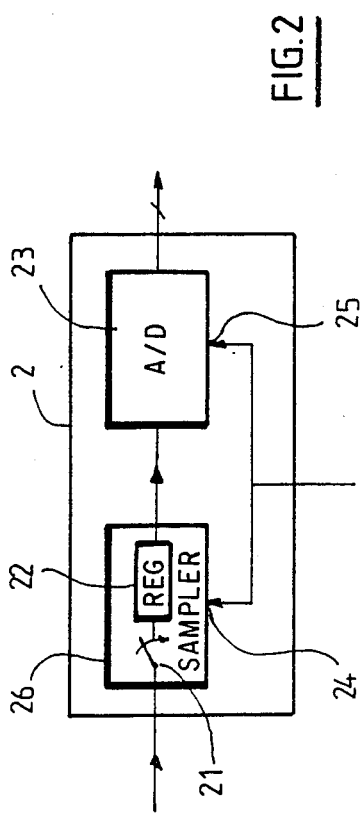
FIG. 2 shows a sample-and-hold analog-to-digital converter.

In FIG. 2, the filtered analog signal $S(t)$ from the filter 1 is sampled in time at 21 at an adjustable rate Fe=1/Te, and the value of each sample is held at 22 until the following sample instant in a sample-and-hold circuit 26 receiving at 24 a sampling signal of rate (or frequency) Fe. The sample-and-hold circuit 26 can be of type LF 198 A of the Societe National Semiconductor. The analog samples from the sample-and-hold circuit 26 are converted into digital form, typically binary of 12 to 14 bits, preferably more than 14 bits, in an analog-digital converter 23, for example of type ADC 71 from Societe Burr-Brown, which also receives at 25 the sampling signal of frequency Fe. These operations will be further described later herein.

At output from the unit 2, the analog signal $S(t)$ has been converted to a discrete temporal series of digitised samples S(nte) referred to later simply as $S_n$.

Prior to sampling, the analog signal $S(t)$ is filtered in the filter 1, conveniently a band-pass filter of a type using switching of capacitances (at a rate Fcc).

According to sampling theory (Shannon), the band width of noise around the spectral line corresponding to a particular sinusoidal signal should not exceed the sampling frequency, otherwise the determination of frequencies required herein will be regarded by fold-over distortion of the frequencies. It will be noted that it is preferred herein to use a band-pass filter rather than a low-pass filter, so that this thereof of Shannon applies to the pass-band, rather than to the cut-off frequency of a low-pass filter, which makes it possible to reduce the sampling rate and ensure it is lower than the frequency to be measured. As practical filters are not ideal, a slightly greater sampling rate or frequency is adopted, and risk of slight effects of overlap of frequencies tolerated as a practical compromise.

Figure 3:
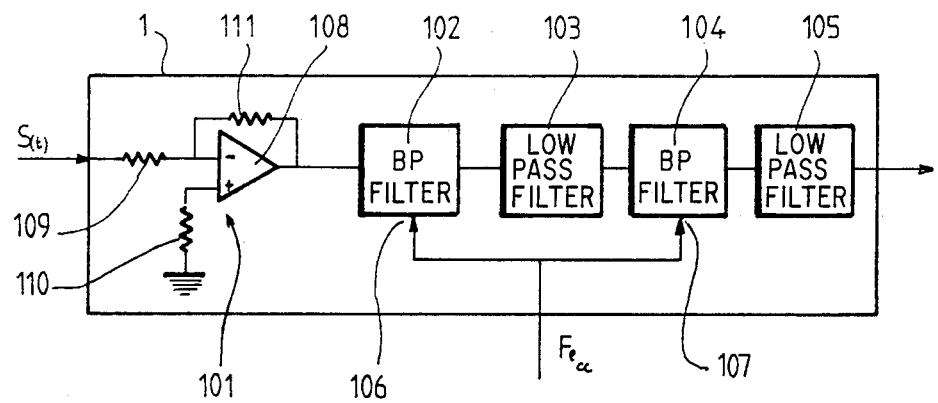
FIG. 3 shows an anti-foldover analog filter.

In FIG. 3, the analog filter 1 is shown as a series connection of an input stage 101, a first switched-capacitance band-pass filter 102, a first second-order low-pass filter 103 for smoothing purposes, a second switched-capacitance band-pass filter 104, and a second second-order low-pass filter 105 for smoothing purposes, The band-pass filters 102 and 104 receive at 106, 107 an appropriate switching signal at frequency $Fe_{Fcc}$, also to be further described below.

The input stage 101, is an amplifier stage comprising an operational amplifier 108 receiving the signal $S(t)$ on its minus input over a resistor 109 and having its plus input connected to earth over a resistor 110 of a value half that of the resistor 109. The plus input and the output of the amplifier are connected over a resistor 111 of the same value as the resistor 109.

Figure 4:
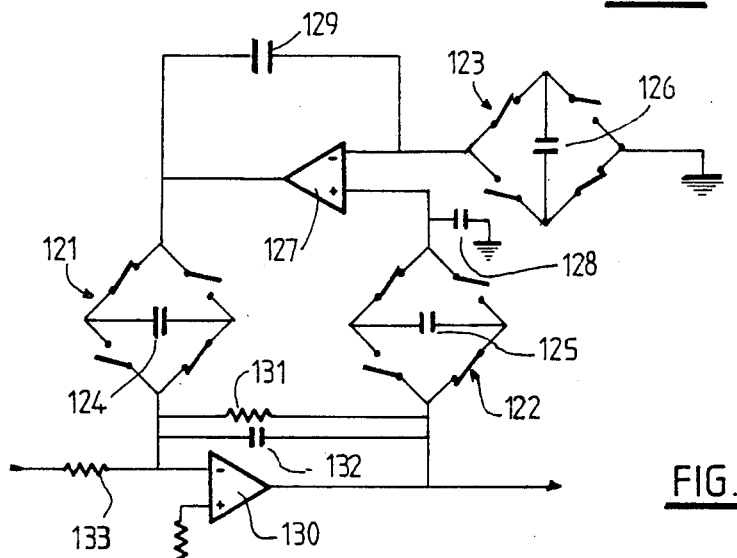
FIG. 4 shows one switched capacitence band-pass analog filter employed in FIG. 3.

The structure of the band-pass analog filters 102, 104 is shown in FIG. 4 as comprising three bridges 121, 122, 123, each having four analog switches, one in each bridge arm (for example of the type DG 201 A from Societe Siliconix). One of the diagonals of the bridges 121, 122, 123 includes a capacitor 124, 125, 126, respectively, all of the same capacitance $C_1$. The switches of each bridge are ganged in pairs for opposite bridge arms to be in the same state, to open during one portion ($\phi_0$ or $\phi_1$) of the period $1/Fe_{Fcc}$ and to close during the other portion ($\phi_1$ or $\phi_0$) as controlled in alternation by a switching or commutation signal. The three bridges 121, 122, 123 have one of their two terminals between adjacent bridge arms, and not connected to the capacitor of the bridge, connected, respectively, to the filter output, to the plus input of operational amplifier 127, and to the minus input of the latter. The plus input of the operational amplifier 127 goes to earth through a capacitor 128 of capacitance C, and its minus input and its output are joined by a capacitor 129 also of capacitance C. The other inter-arm terminals of the bridges 121, 122 are connected respectively to minus input and to output of another operational amplifier 130, and have parallel connections through a resistor 131 of value $R_1$ and through a capacitor 132 of capacitance C. The plus input of the amplifier 130 is connected to earth. Input of the filter is connected to minus input of the amplifier 130 by a resistor 133 of value $R_1$, and output of the amplifier 130 constitutes the output of the filter. The other inter-arm terminal of the bridge 123 is connected to earth. The central frequency $f_0$ of these filters 102, 104 is given by $$f_o = \frac{2F_{eFcc}}{\pi} \times \frac{C_1}{C}$$

and the band-width of the filter at $-3$ dB by $$\Delta f = \frac{1}{2\pi R_1 C}$$

the gain of the filter being unity for the central frequency.

A formula giving the value of the central frequency is known from Switched-Capacitor Filter Design Using the Bilinear Z-Transform, Gabor C. Temes et al., IEEE Transactions on Circuits and Systems, Vol 25 No. 12, December 1978, and can also be written $$f_o = \frac{1}{\beta} \cdot F_{eFcc}, \text{ where } F_{eFcc} = \beta f_o$$
$$\text{and} \quad \beta = \frac{\pi}{2} \times \frac{C}{C_1}$$

A value for $\beta$ can be from a few unit to several hundreds. In practice, a value of $C/C_1$ that is not too high will usually be chosen. However, distortion associated with the transfer function of the filter does decrease for high $\beta$, so choice of $\beta$ is a compromise.

Also, the greater is $\Delta f$, the less it is necessary to modify the switching rate of frequency $F_{eFcc}$ from one domain of $F_x$ to another, but, the smaller is $\Delta f$, the less effect overlap of frequencies has upon subsequent sampling.

In fact, it is found necessary to modify the switching rate or frequency $F_{eFcc}$ when the difference $|F_x - f_0|$ becomes close to $(\Delta f)/2$.

Purely by way of example, one specific embodiment of this invention uses:

$$C = 0.1 \mu F; \quad C_1 = 3.92 \mu F$$
$$R_1 = 14 \text{ or } 24.3 \text{ k}\Omega; \quad \beta = 40.07$$

$R_1$ being chosen preferably in the range $[14\text{k}\Omega - 61.9\text{k}\Omega]$ according to the desired value of $\Delta f$.

Figure 5:
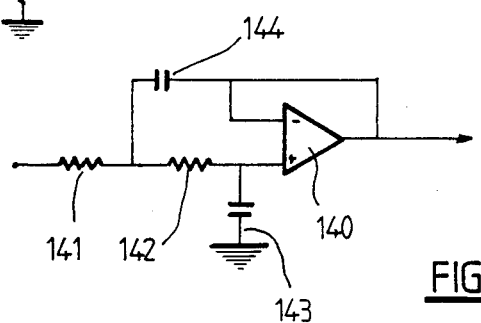
FIG. 5 shows a first low-pass analog smoothing filter employed in FIG. 3.

The structure of the first second-order low-pass smoothing filter 103 is shown on FIG. 5. It comprises an operational amplifier 140 the plus input of which goes to earth by a capacitor 143 of capacitance $C_2$ and to the input of the filter by way of two resistors 141, 142 in series and of the same value $R_2$. The minus input of the amplifier 140 is connected, on the one hand, to the node between the two resistors 141, 142 by way of a capacitor 144 of capacitance $C_3$, and, on the other hand, to the output of the amplifier 140 forming the output of the filter 103.

The cut-off frequency $f_c$ of this filter (103) is given by $$f_{c1} = 1/(2\pi R_2 \sqrt{C_2 C_3})$$

and the gain of the filter 103 is unity.

Figure 6:
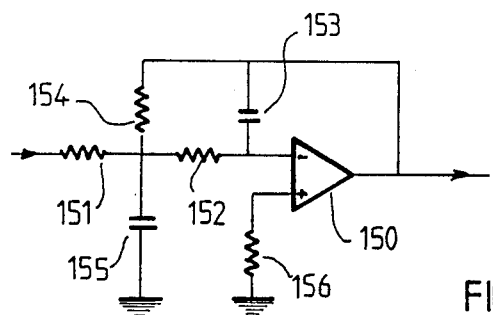
FIG. 6 shows a second low-pass analog smoothing filter employed in FIG. 3.

The structure of the second-order low-pass smoothing filter 105 is shown in FIG. 6. It comprises an operational amplifier 150 the minus input of which is connected to the filter input by way of two resistors 151, 152 to respective values $R_3$, $R_4$, and the plus input of which goes to earth over a resistor 156 of value $R_5$. The output of the amplifier 150 is connected to its minus input by a capacitor 153 of capacitance $C_4$ and also goes by way of a resistor 154 of value $R_6$ to the node between the two resistors 151, 152, which node is connected to earth by way of a capacitor 155 of capacitance $C_5$.

The cut-off frequency $f_{c2}$ of this filter is given by $$f_{c2} = 1/(2\pi \sqrt{R_4 R_6 C_4 C_5})$$

and the gain of the filter 105 is $-R_6/R_3$

In the above specific embodiment, $f_{c1} = f_{c2} = 4.3$ kHz.

Returning to the digitised samples $S_n$ from the converter 23, and using the Z-transform relation to a sinusoidal signal, as given in "Systemes et asservissements echantillonés of Y. Sévely, Editions DUNOD, 1973", the succession of said sample can be seen as representing response to a pulse at the origin (time) and for a Z filter with a transfer function $F(Z)$ $$f(z) = \frac{\rho(z)}{\epsilon(z)} = \frac{\sin(2\pi FaFe) \times Z}{Z^2 - aZ + 1}$$

where $\rho(Z)$ and $\epsilon(Z)$ are respectively Z-transforms of the output and of the input of the filter, and $\epsilon(Z) = 1$ if the input is taken as a unitary pulse at the origin (time) and $a = 2 \cos(2\pi FaTe)$, where Fa is defined as $Fa = |(Fx - M \cdot Fe)|$ and M is a positive entity such that Fa lies between 0 and Fe/2.

In effect, $\cos(2\pi FaTe) = \cos\{2\pi(Fx.Te-M)\}$.

This indetermination rises if M is determined by approximate knowledge of Fx, which can be obtained in an initialisation phase, for example using a sampling rate of $Fe > 2 Fx$ for that phase.

Hereinafter, reference is made indiscriminately to $F_a$ or $F_x$ knowing that if $Fe < 2Fx$, Fa applies; and the real value Fx is deduced therefrom knowing M.

$Z = \exp(2\pi j\nu Te)$, where $j = \sqrt{-1}$ and $\nu$ is the Fourier frequency By definition:

$$S(z) = \frac{\sin(2\pi F_x T_e) \times Z\epsilon(z)}{Z^2 - aZ + 1} = \sum_{n=0}^{\infty} S_n Z^{-n}$$

where $s_n$ is the said sample representing the value of the amplitude of the sinusoidal signal $\sin(2\pi F_x t)$ at the instant $t = nTe$ By application of conventional theory (as in the above mentioned work)

$$\rho(Z) \cdot [Z^2 - aZ + 1] = Z\epsilon(Z) \cdot \sin(2\pi F_x T_e)$$

where $\epsilon(Z) = 1 = Z^0$ which, expressed in the time domain, gives:

$$s_{n+2} - a \cdot s_{n+1} + 1 = \sin(2\pi F_x T_e) \cdot e_{n+1}$$

As, by hypothesis, $e_{n+1}$ is always nil save for $n=0$ (pulse at the time zero), then at $n=0$:

$$S_2 = e_1 \sin(2\pi F_x Fe)$$

$$S_1 = S_0 = 0$$

and, for $n \geq 1$ and for three consecutive samples of the sinusoidal signal $$S_{n+2} \cdot a \cdot S_{n+1} + S_n = 0$$

The "frequency" information of the sampled signal is contained in the term $a = 2 \cos 2\pi F_x T_e$.

Substituting $y_n = S_{n+z} + S_n$ and $x_n = S_{n+1}$, the above equation becomes $y_n = a \cdot x_n$.

With this relation, estimations for $a$ are readily made, and the values of the frequency $F_x$ calculated from $$F_x = \frac{1}{2\pi T_e} a/c \cot \frac{a}{2}$$

As estimations $\hat{a}$, consider $$\hat{a} = \frac{\sum_{n=1}^{N} y_n}{\sum_{n=1}^{N} x_n}$$

or $$\hat{a} = \left[ \frac{\sum_{n=1}^{N} \left( y_n - \frac{1}{N} \sum_{n=1}^{N} y_n \right)^2}{\sum_{n=1}^{N} \left( x_n - \frac{1}{N} \sum_{n=1}^{N} x_n \right)^2} \right]^{\frac{1}{2}} \left( = \frac{\delta_y}{\delta_x} \right)$$

In practice, these values contain error because of noise superimposed on the signal. In particular, any continuous component, even after digitisation, affects the first above estimation, and a value of N which is not a multiple of Fe/Fx affects both estimations.

The second estimation is nevertheless preferred, for the initialisation of the frequency measurement, to the placing under tension for example, which initialisation will be mentioned later on.

In general, the equation having a single unknown a, $y_n = a x_n$, is advantageously solved by linear regression using the method of least squares. In other words, by method of least squares, a is identified as a linear relation representing linear regression of $y_n$ to $x_n$.

It is useful to proceed with estimation around the mean values of the variables, to eliminate the continuous component of the signal, also an estimation error arising from being unable to estimate over an infinite period nor, in general, even over a whole number of periods of the signal.

As formula for estimation, consider $$\hat{a} = \frac{E\{[y_n - E(y_n)][x_n - E(x_n)]\}}{E\{[x_n - E(x_n)]^2\}}$$

where E presents the mathematical expectation, which can be approximated, for N sufficiently large, by $$E(x) \simeq \frac{1}{N} \cdot \sum_{i=1}^{N} x_{i+k} = XM_k$$

In these conditions, $E(x_n)$ and $E(y_n)$ are the mean values of $x_n$ and $y_n$ estimated on a time horizon of duration NTe and will be written $XM_K$ and $YM_K$, the index K indicating the current horizon. Also, $E[X_n - E(x_n)]^2$ is the centered second order moment, or variance, of the variable $x_n$ estimated on the horizon NTe. And
$E\{[y_n - E(y_n)][x_n - E(x_n)]\}$ is the compound moment, or covariance of the centered variables $x_n$ and $y_n$ estimated on the same time horizon NTe. Using $$C_{xxk} = \sum_{n=1}^{N} x_{n+k}^2 \text{ and } C_{yyk} = \sum_{n=1}^{N} x_{n+k} \cdot y_{n+k}$$

the estimated value of a can be written $$\hat{a}_k = \frac{C_{yyk} - \frac{XM_x Y_k}{N}}{C_{xxk} - \frac{(XM_k)^2}{N}}$$

This relation can be further modified to take account of the additional noise superimposed on the signal and which can falsify the estimation $\hat{a}$, more especially if the noise on $y_n$ is not white and if it is correlated with $x_n$:

$$\hat{a}_n = \frac{C_{yzk} - \frac{YM_k \cdot ZM_k}{N}}{C_{xzk} - \frac{XM_k \cdot ZM_k}{N}}$$

where the index z corresponds to the variable $z_n$ correlated with $x_n$, but the noise of which is not correlated either with the noise on $x_n$ or with the noise on $y_n$.

$z_n$ can therefore be chosen to be $x_{n-M}$, viz $Z_n = x_{n-M}$

As preferred refinement to minimize estimation errors due to noise on the sampled signal, the digitised signal from the converter 23 goes through the band-pass digital filter 3, which has a very narrow band. The filter 3 serves substantially to eliminate the continuous component and makes it possible to obtain a sinusoidal signal with very little noise.

If $b_n$ is the noise at the instant nTe on the sample $s_n$, consider $$y_n = S_{n+2} + S_n + b_{n+2} + b_n = y_n^* + by_n$$

$$x_n = S_{n+1} + b_{n+1} = x_n^* + bx_n$$

where $x_n^*$ and $y_n^*$ represent values of noise. Then, assuming the means values of the noise and of the signal are nil, the relation $$\hat{a} = \frac{E\{[y_n - E(y_n)][x_n \cdot E(x_n)]\}}{E[x_n - E(x_n)]^2}$$

becomes:

$$\hat{a} = \frac{E(y_n^* x_n^*) + E(x_n^* by_n) + E(y_n^* bx_n) + E(by_n bx_n)}{E(x_n^*)^2 + E(bx_n)^2 + E(x_n^2 bx_n)}$$

For white noise,
$E(by_n bx_n) = 0$ and for noise not correlated with the signal:

$E(x_n^* bx_n) = E(y_n^* bx_n) = E(x_n^* by_n) = 0$

So, $$\hat{a} = \frac{E(x_n^* y_n^*)}{E(x_n^*)^2 + \delta_x^2}$$

where $\partial x^2$ is the variance of white noise on the signal.

The estimate of a as thus affected by the variance of the noise becomes $a=a*(1-\partial x^2/E^2)$ where $E^2$ is the variance of the signal and $\partial x^2/E^2$ is the inverse of the signal-to-noise ratio.

The function of the digital filter 3 is thus to reduce the variance of the additional noise, so that the signal-to-noise ratio is much greater than 1 (ratios greater than 1500 are achievable for a nuclear oscillator), in effect to use the formula $$\hat{a}_k = \frac{Cxy_k - \frac{XM_k YM_k}{N}}{Cxx_k - \frac{XM_k^2}{N}}$$

to obtain only very slightly biassed estimation of $a_K$ at a rate N times lower than the sampling frequency Fe.

Implementation of this formula is by way of a sub-sampling operation. Shannon's theorem regarding sampling (as has already been discussed) requires the bandwidth of the noise around the spectral line corresponding to the sinusoidal signal to be less than the sampling frequency, otherwise with degradation of estimation be frequency distortion (foldover). In this particular case, the sampling calculation frequency of a is Fe/N; so the width of the digital band-pass filter 3 is preferably a fraction of Fe/N for frequency distortion (foldover) to be slight.

The function of the filter 3, tied in with the frequency of the signal, is represented by:

$$S_{n+2}=(\lambda \hat{a}_K*)S_{n+1}-\lambda^2 S_n+\gamma S_{n+2}$$

where $\lambda$ is a constant representating damping and width of the filter at $-3dB$, $a_K*$ is the value of $a_K$ filtered by a low-pass filter, for example of the first order, in order to smooth the value of the parameter fixing the centre of the band-pass filter, $s_n$ is the filtered sampled at the output of the band-pass filter at the instant nTe, $\gamma$ is a centering of framing constant fixing the static gain of the filter, and can be unity $s_{n+2}$ is the non-filtered sample, from the sampler 2 at the instant $(n+2)$Te.

Frequency measurement as described so far can thus be summarised as:

filtering the analog periodic signal S(t) at frequency $F_x$ in the analog filter 1 to limit sampling, frequency distortion (folding) at sampling sampling the filtered original at the rate Fe and digitising at 12 to 14 bits or more in the unit 2, filtering the sequence of digitised samples $s_{n+2}$ in the digital filter 3 in order to increase the signal-to-noise ratio and to reduce the calculation rate Fe/N for a (in the calculating unit 4), relative to the sampling rate Fe, using the calculating unit 4, in order to calculate, from the values $s_{n+2}$, $s_{n+1}$, $s_n$ supplied by the filter 3, and at the instants i Te, with $i=(n+2)$, discrete sequences for $x_i$, $y_i$, and accrued values XM, YM and Cxx of $x_i$, $y_i$ and $x_i^2$ respectively. where:

$$XM = \sum_{i=1}^{N} x_i; \quad YM = \sum_{i=1}^{N} y_i; \quad Cxx = \sum_{i=1}^{N} x_i^2$$

calculating in the calculating unit 5, every N cycles centered value $$C'xy_k \text{ of } Cxy, \text{ where } C'xy = Cxy = \frac{XM \cdot YM}{N}$$

centered value $$C'xy_k \text{ of } Cxx, \text{ where } C'xx = Cxx = \frac{XM^2}{N}$$

value of $\hat{a}_K$ as ratio of the two centered values, i.e.

$$\hat{a}_k = \frac{C'xy_k}{C'xx_k}$$

where K is the index of the interval of duration NTe, to correspond with the rte of the calculations of the unit 5 being Fe/N, effectively to estimate by the method of least squares a single coefficient of linear regression between successive digitised samples, which coefficient contains frequency information for the sampled signal.

reinitialising the values calculated in the unit 4 to zero, using portion 5' of the unit 5.

Every N cycles the calculation unit 5 supplies the value of $\hat{a}_k$, and that value is filtered in the first-order low-pass digital smoothing filter 8 to supply the value of $\hat{a}_K*$ multiplied by $\lambda$ in the unit 9 which then supplies the value of $(\lambda \hat{a}_K*)$ to the digital filter 3. The action of the filter is represented by:

$$\hat{a}_K* = K_1 \hat{a}*_{K-1} + K_2(\hat{a}_K + \hat{a}_{K-1})$$

where $$k_1 = \frac{W-1}{W+1}, \quad k_2 = \frac{1}{W+1}, \quad W = 1/[\tan(\pi Fe/Fe/N)]$$

The calculating rate of $\hat{a}_K$ is Fe/N, and it is of interest to calculate the frequency $F_x$ at a lower rate using sub-sampling.

Before this sub-sampling, it is preferred to filter the values of $\hat{a}_K$ as done in the filtering and sub-sampling unit 6.

The simplest filtering comprises determining the mean value over L measurements, in accordance with the function $$\hat{a}_{K/L} = \frac{1}{L} \sum_{k=1}^{L} a_{k+L}$$

the value $\hat{a}_{K/L}$ therefore being supplied every N.L cycles.

Alternatively, second to fourth-order low-pass filtering could be used, represented by the general function $$\hat{a}_K* = \sum_{i=0}^{I} b_i a_{k-i}* + \sum_{j=0}^{J} c_j a_{k-j}$$

which is of more complex implementation, $b_i$ and $c_j$ being the parameters defining the filter.

The frequency $F_x$ is then determined in the calculating unit 7. Primarily, the frequency information $F_x$ was shown to be contained in a according to the relation:

$$Fx = \frac{Fe}{2\pi} \arccos \frac{a}{2}$$

If $0 < Fe < 2Fx$, Fx is given by the relation $$Fx = \frac{Fe}{\pi} \arccos \frac{a}{2} + MFe$$

M being a positive integer.

Consequently, estimate $\hat{F}_a$ of apparent frequency can be represented by $$\hat{F}_a = \frac{Fe}{2\pi} \arccos \frac{\hat{a}_{K/L}}{2}$$

and $$\hat{F}_x = \hat{F}_a MF$$

Such "frequency" information appears in output of the unit 7, conveniently, at this juncture, using 32 bits.

If the optimum sampling frequency Fe* is equal to $\alpha F_x$ ($\hat{F}_x$ being the estimate of the frequency of the input signal); the value of M determines that of $\alpha$.

In fact, for a good precision of calculation, the frequency Fe is chosen such that Fa=Fe/4 in order that $\cos(2\pi Fa/Fe)$ is such that $\cos(2\pi Fa/Fe.a/2$ is nil, or very small in relation to 1.
Then $F_a = F_x = MFe \neq Fe/4$
Hence $Fe = \alpha F_x$, $\alpha = 4/(4M+1)$
So, or M=1, then $\alpha = 4/5$
M=2, then $\alpha = 4/9$
M=3, then $\alpha = 4/13$
The function of the filter 3 is represented by $$S_{n+2} = (\lambda a_K^*) \cdot S_{n+1} - \lambda^2 \cdot S_n + \gamma \cdot S_{n+2}$$

The value of $\lambda$ fixes the width at −3dB of the filter 3, which has to be greater than or equal to the pass-band for variations of the frequency $F_x$.

In one actual embodiment,
$\lambda = 1 - 1/64$ viz
$\lambda^2 \neq 1 - 1/32$

This choice makes it possible to satisfy the approximation
$\Delta fc \simeq 2$ Hz since, and with reference to the work "Traitement numerique du signal, M. Bellanger, Editions Masson, 1984", on has
$\Delta fc \simeq \hat{F}a/Q$
where $$Q \simeq 1 / \left[ (1 - \lambda^2) \sqrt{\left(1 - \frac{a^2}{2}\right)} \right]$$

If $Fe = \frac{k}{a} Fx$, then $\hat{F}a \simeq \frac{Fe}{4}$, hence $\hat{a} \simeq 0$ Considering the relation $\Delta fc \simeq \hat{F}a/32$ If $\hat{F}a$ is substantially greater than 90/4, then fc is substantially greater than 3 Hz The maximum pass-band of $\hat{a}_k$, or that of the variations of $F_x$, is equal to Fe/2N, N being the number of values on which the unit 4 calculates.

In order that the frequency distortion (folding) remains low, it is necessary for the passing band $\Delta fc/2$ to remain lower than the passing band, i.e. $Fe/2N >> \hat{F}a/2Q$ Where $F_a$ is little different from Fe/4, the inequality $N \leq Q$ needs to be satisfied.

Taking $N \simeq Q$, gives N=32.

Turning to choice of the factor $\alpha$, if calculating capacity so permits (but not as envisaged above) $\alpha$ can be made very large in relation to 1, at least equal to 2.5. The filter 1 could then be a simple low-pass filter, of order high enough for frequency distortion (folding) effects to be low.

However, as above, choosing a value of $\alpha$ lower than 1, requires the filter 1 to be a band-pass filter of width $\Delta f$ lower than Fe, in order to satisfy Shannon's theorem.

Furthermore, for $\Delta f \simeq 160$ HZ, M being given and determining $\alpha$, Fe is chosen by the relations $$Fe = \alpha \hat{F}x, \text{ for } 1000 \text{ Hz} < \hat{F}x < 1500 \text{ Hz}$$

$$Fe = (\alpha/2) \hat{F}x, \text{ for } 1500 \text{ Hz} \leq \hat{F}x < 3000 \text{ Hz}$$

Upon initialisation (discussed later), or a change of Fe, $\alpha$ is chosen as close as possible to 4/5, if the calculating capacity so permits. To reduce calculating rates, $\alpha$ can be chosen very close to 4/9.

For frequencies $\hat{F}_x$ lower than 1000 HZ, Fe can nevertheless be determined as if $\hat{F}_x$ was practically equal to 1000 HZ; the value of Fe being modified only if the ratio $\hat{F}a/Fe$ is not in the range [0.05−0.47].

Above, values of $\hat{a}_K$ were supplied by the calculating unit 5 at rate Fe/N. But, as Fe depends on $F_x$, values of $\hat{a}_K$ will not be supplied at a fixed rate, which can be a drawback. Consequently, and to obtain values of $\hat{a}_K$ at a fixed rate, for example a sub-multiple or close to Fe/N, an interpolator of extrapolator filter can be used, such as taught in the works "Systemes et asservissements lineaires echantillonnes" and "Traitement numerique du signal", already referred to above.

A simpler method, involves choosing a sampling frequency Fe which satisfies simultaneously the following conditions: for a predetermined fixed frequency Fs, for example 25 Hz, for 1000 Hz $< \hat{F}_x <$ 1500 Hz $$\begin{cases} Fe \simeq \alpha \hat{F}_x \\ Fe = k_1 Fs \end{cases}$$

where $K_1$ a positive integer at 1500 Hz $< \hat{F}_x <$ 3000 Hz $$\begin{cases} Fe \simeq \frac{\alpha}{2} \hat{F}_x \\ Fe = k_2 Fs \end{cases}$$

where $k_2$ a positive integer

The frequency information $\hat{F}_x$ supplied by the calculating unit 7 goes to the unit 10 for calculating optimum frequencies Fe and $Fe_{Fcc}$ in accordance with the relations already referred to $$Fe = \alpha \hat{F}_x \text{ or } Fe = \frac{\alpha}{2} \hat{F}_x,$$

$$Fe_{Fcc} = \beta f_o$$

$$\beta = \frac{\pi}{2} \times \frac{C}{C_1}$$

If $\beta = 40$, $Fe_{Fcc} = 40 \hat{F}_x$.

The calculating unit 10 controlled by the unit 11 for monitoring Fe and $Fe_{Fcc}$, which determines the entire portion N' of FQ/Fe*, conveniently 12 bits, and the entire portion N" of FQ/2$Fe_{Fcc}$, conveniently 8 bits. N' and N" feed the two programmable dividers 14 and 15, respectively, connected to the output of the reference clock 13 of frequency $F_H$.

The clock 13 can be of quartz type available as PMT P5 or PMT U515 from the Compangie d'Electronique et de Piezoelectricite (CEPE).

Figure 7:
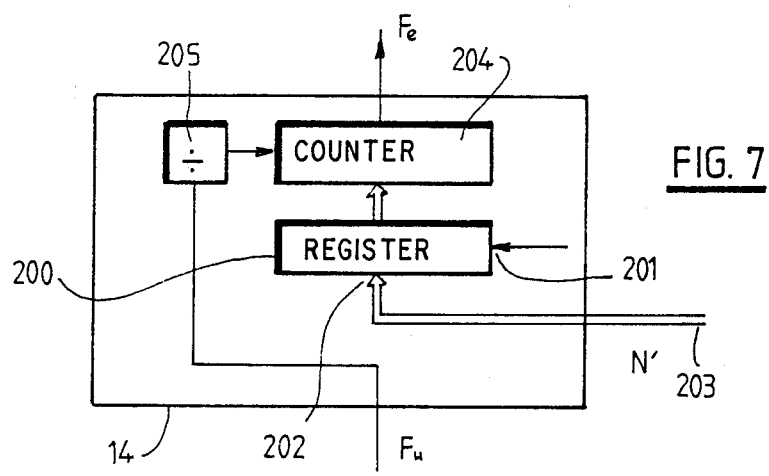
FIG. 7 shows a programmable divider for supplying sampling rate.

In FIG. 7, the programmable divider 14 comprises register means 200 (actually two registers in parallel) receiving load signals at one input 201 and data N' at other inputs 202 from a bus 203, and supplying counter means 204 (actually three counters in cascade) controlled by signal $F_H$ from clock 13 but by way of a divider 205, here dividing by 2, and giving $$F_e = \frac{F_H}{N^1}$$

Figure 8:
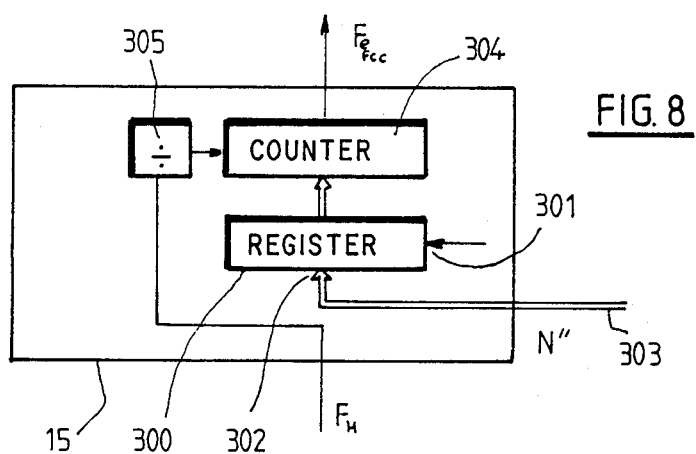
FIG. 8 shows a programmable divider for supplying the switching rate for switched-capacitance filters.

In FIG. 8, the programmable divider 15 comprises a register means 300 receiving load signals at its input 301 and data N" at its input 302 from a bus 303, and supplying counter means 304 (actually two counters 304 in cascade) controlled by signal $F_H$ from clock 13 by way of a divider 305, here dividing by 2, and supplying $$Fe_{Fcc} = F_H/2N'$$

By way of example, one specific implementation has:

$F_H \approx 10$ MHZ $41 \leq N'' \leq 128$ $3571 \leq N' \leq 14286$

The units 5 to 11 described can be implemented using a processor or calculator available commercially, for example of the type Alpha 732 from the applicant firm or 9900 from Societe Texas Instruments.

Frequency measuring just described operated either in normal mode, or in an initialisation mode. Such initialisation mode results either from the start-up/commissioning, or from a re-initialisation order, say a reset to zero, for example for change of frequency range to higher than the pass-band at about −10dB for the digital filter 3.

Initialisation entails choice of the switching frequency $Fe_{Fcc}$, which determines the central frequency fo of the analog filter 1, according to the relation $fo = Fe_{Fcc}/\beta$ as well as choice of the sampling frequency Fe of the signal.

If the frequency is known, or can be guessed with a precision of the order of one percent, that value is chosen for the frequency measuring means and entered by any appropriate means, for example a digital keyboard.

If the frequency is not known or cannot be guessed with such precision, two situations arise.

If the anti-foldover analog filter 1 comprises only a single second-order low-pass filter (103 or 105) of cut-off frequency $F_{cc}$, Fé is set at about 2.5 $F_{cc}$ and λ at zero.

Consequent $\hat{a}_K$ and $\hat{F}_x$ are calculated over several seconds, and the mean value of $F_x$ over several seconds is adopted as initial value for $F_x$, making it possible to calculate initial values of Fe and $Fe_{Fcc}$. During a second initialisation phase of several seconds, with λ not zero, the preceding initial values are recalculated.

If the anti-folding analog filter 1 includes at least one of the switching-capacitance filters (102 or 104) and one of the second-order low-pass filters (103 or 105) the signal-to-noise ratio will be reduced. Displacing the central frequency $f_0$ of the switching-capacitance filter in the full domain $D_f$ of frequencies to be measured, the number of values to be taken into account for the programmable divider 15 is equal to the full portion of the ratio $D_F/\beta_{Fcc}$, where $\beta_{Fcc}$ is the band width at −3dB of the filter 1. The central value of the filter 1 at each different value as taken into account in the programmable divider is spaced by $\beta_{Fcc}$ from the preceding one. For each of these values, $C_{xx}$ is calculated with λ nil and Fe ranging from 2.5 to 3 $F_{cc}$, and the initial value adapted for the divider 15 will be that corresponding to the maximum of $C_{xx}$. As in the previous case, one then uses the initial value of $F_x$ and calculated N' and N" of the programmable dividers 14, 15.

The initialization process is implemented in the unit 16 controlling the calculating unit 10.

The values of $Fe_{Fcc}$ and Fe are monitored and can be adjusted in order to assure $0.05 \leq Fa/Fe \leq 0.47$ and $|F_x - f_0| \leq (\Delta f)/2$.

I claim:

1. A method of measuring the frequency $F_x$ of a periodic signal S(t), where $S(t) = A \sin 2\pi F_x + B(T)$, comprising the steps of
   (i) filtering (1) the signal S(t) to limit foldover frequency distortion;
   (ii) sampling (2) the filtered signal at a sampling rate of Fe = 1/Te, where $T_e$ is the period of the filtered signal, and generating a digital signal comprising a series of digitized values of the samples,
   (iii) filtering the digital signal using a narrow band-pass filter (3) having a predetermined central frequency, thereby increasing a signal-to-noise ratio of said digital signal,
   (iv) performing a linear regression on said digitized values of said signal to produce a series of smoothed digital values constituting a smoothed digital output signal comprising values consisting of, said linear regression using based on a single coefficient a, by means of a least square calculating method of a linear relation between successive ones of said digitized samples, wherein an intermediate digitized sample $S_{n+1}$ is related to a previous digitized sample $S_n$ and a subsequent digitized sample $S_{n+2}$ as:

$$S_{n+2} + S_n = a \cdot S_{n+1}$$

wherein $a = 2 \cos 2\pi F_x Te$,
   (v) calculating, at a rate Fe/N, wherein N is a predetermined integer, an estimation â of the coefficient a to derive the frequency $F_x$ according to the relation $F_x = (Fe/2\pi) \arccos (a/2)$, and
   (vi) controlling the central frequency of the narrow band-pass filter to be equal to an estimated frequency of the sampled digitized signal.

2. A method according to claim 1, wherein the sampling step (2) is performed at a sampling rate Fe lower than the frequency $F_x$ to be measured and the filtering (1) prior to sampling is performed using a band-pass filter (8, 9) centered on the frequency $F_x$ to be measured.

3. A method according to claim 1, wherein filtering (1) of the signal S(t) prior to sampling is performed using a low-pass band and sampling (2) of the filtered signal is performed at a sampling rate Fe higher than the frequency $F_x$ to be measured.

4. A method according to claim 1, wherein said linear regression starts relative to the mean values of variables estimated at a time temporal horizon NTe.

5. A method according to claim 1, wherein the sampling frequency Fe is less than the frequency to be measured, and the frequency to be measured is determined by adding to a calculated frequency Fa the product of the sampling rate Fe and a predetermined integer entity K.

6. A method according to claim 1, wherein step of filtering the digital signal is performed according to a band-pass function such that:

$$S_{n+2} = (\lambda \hat{a}^*) S_{n+1} - \lambda^2 S_n + \gamma S_{n+2}$$

where:

$\lambda$ is a constant representing damping and width of the filter at $-3dB$, $\hat{a}^*$ is an estimate of a filtered on a low-pass basis in order to smooth the value of a parameter determining centering of the band-pass $\gamma$ is a framing constant fixing static gain for the band-pass $S_{n+2}$ is an unfiltered sample at instant $(n+2)Te$, and $s_n$ is a filtered sample at instant nTe.

7. A method according to claim 1, further comprising a step of subsampling (6) at a rate L times lower than for the coefficient a in determining (7) the frequency to be measured.

8. A method according to claim 1, wherein the value of the coefficient a is determined using a predetermined frequency desynchronization performed in an interpolator or extrapolator filter.

9. A method according to claim 1, wherein further comprising an initialization step for (16) calculating estimates of a and of $F_x$ over several seconds and calculating a mean value using estimates as an initial value of $F_x$.

10. A frequency meter for measuring the frequency $F_x$ of a periodic signal S(t), where $S(t) = A \sin 2\pi F_x + B(T)$, comprising:

a series connection of an anti-foldover analog filter (1), and means (2) for sampling and performing analog-to-digital conversion of said periodic signal for generating a digital signal comprising a series of digital values representing said periodic signal, a slaved digital band-pass filter (3) having an input receiving said digital signal and an output for supplying a filtered digital signal, and calculating means (4-7) for performing a linear regression calculation on said filtered digital signal, said linear regression calculation using a single coefficient a for determining a linear relationship between successive digitized samples of said filtered digital signal from the slaved digital band-pass filter, said calculating means further generating an estimation of the coefficient a from which the frequency to be measured is approximated.

11. A frequency meter according to claim 10, further comprising an input stage for receiving said periodic signal including an anti-foldover analog filter having a band-pass filter (102, 104) using switching of capacitances according to a switching signal, and a first programmable divider (15) responsive to a reference clock signal (13) and controlled by the calculating means (4-7) to produce the switching signal.

12. A frequency meter according to claim 11, wherein the anti-folder analog filter (1) comprises at least one low-pass smoothing filter (103, 105).

13. A frequency meter according to claim 11, further comprising a second programmable divider (14) responsive to the reference clock signal (13) and controlled by the calculating means (4-7) to provide a coupling signal for the sampling and analog-digital conversion means (2).

14. A frequency meter according to claim 13, in which the calculating means (4-7) controls the first and second programmable dividers (15, 14), said calculating means further including a switching unit (10) for calculating switching and sampling rates, and monitoring means (11) for monitoring said switching and sampling rates.

15. A frequency meter according to claim 11, further comprising an initialization unit (16) connected to the input of the unit (10) for calculating switching and sampling rates.

16. A frequency meter according to claim 10, further comprising a digital low-pass filter by which the slaved digital filter (3) is controlled by the calculating means (4, 5).

* * * * *